United States Patent [19]

Mori

[11] Patent Number: 5,310,426
[45] Date of Patent: May 10, 1994

[54] HIGH-SPEED FILM FORMING METHOD BY MICROWAVE PLASMA CHEMICAL VAPOR DEPOSITION (CVD) UNDER HIGH PRESSURE AND AN APPARATUS THEREFOR

[75] Inventor: Yuzo Mori, Osaka, Japan

[73] Assignee: UHA Mikakuto Precision Engineering Research Institute Co., Ltd., Osaka, Japan

[21] Appl. No.: 681,268

[22] Filed: Apr. 8, 1991

Related U.S. Application Data

[62] Division of Ser. No. 561,639, Aug. 2, 1990, Pat. No. 5,037,666.

[30] Foreign Application Priority Data

Aug. 3, 1989 [JP] Japan .................................. 1-202370

[51] Int. Cl.$^5$ .............................................. C23C 16/50
[52] U.S. Cl. .............................. 118/723 AN; 156/345; 118/715; 118/723 MW
[58] Field of Search ....... 118/723; 156/345, DIG. 68; 427/39, 45.1

[56] References Cited

U.S. PATENT DOCUMENTS

| | | | |
|---|---|---|---|
| 4,160,690 | 7/1979 | Shibayaki et al. .............. | 204/164 X |
| 4,970,435 | 11/1990 | Tanaka et al. .................. | 118/715 X |
| 4,985,109 | 1/1991 | Otsubo et al. ................... | 118/728 X |
| 4,998,979 | 3/1991 | Niino .............................. | 156/643 X |
| 5,015,494 | 5/1991 | Yamazaki ....................... | 118/723 X |

OTHER PUBLICATIONS

"Microwave Plasma CVD System for the Fabrication of Thin Solid Films", Japanese Journal of Applied Physics, vol. 21, No. 8, Aug. 1982, pp. L470-L472.
"The Growth of Diamond in Microwave Plasma Under Low Pressure", Journal of Materials Science 22 (1987) 1557-1562.

Primary Examiner—Brian E. Hearn
Assistant Examiner—Jonathan D. Baskin
Attorney, Agent, or Firm—Armstrong, Westerman, Hattori, McLeland & Naughton

[57] ABSTRACT

A film forming method and an apparatus therefor, in which reactant gas and carrier gas set at 10 torr through several atmospheres, much higher than the conventional plasma CVD gas pressure are put in a plasma condition of high density by utilizing standing waves or progressive waves of the microwave in a predetermined space, and then neutral radicals and ions of reactant species based on the reactant gas are guided to a substrate, thereby forming a thin film thereon at high-speed.

7 Claims, 8 Drawing Sheets

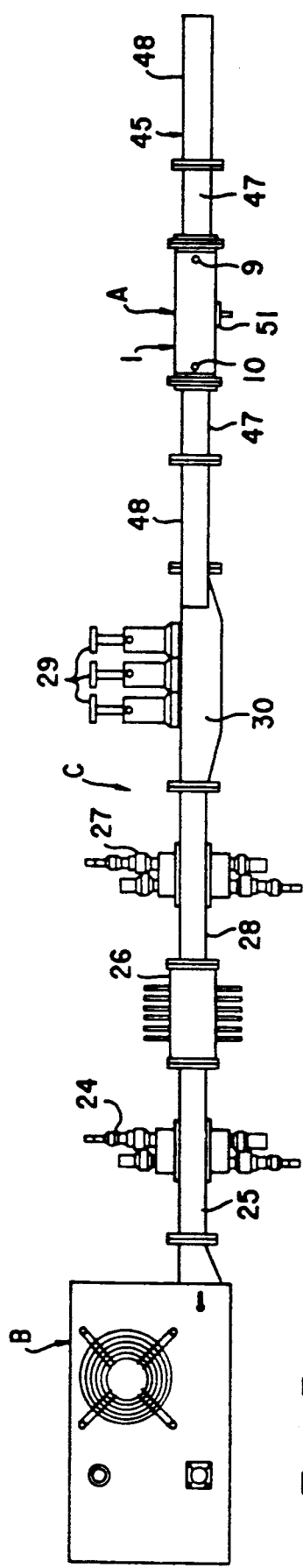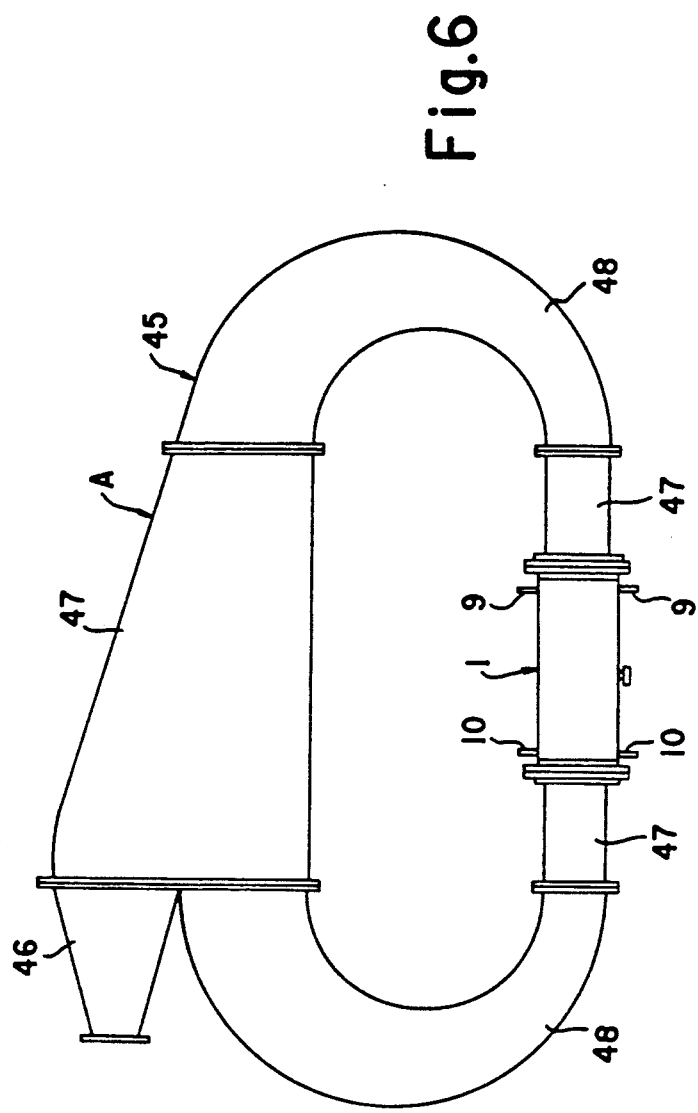
Fig.5
Fig.6

HIGH-SPEED FILM FORMING METHOD BY MICROWAVE PLASMA CHEMICAL VAPOR DEPOSITION (CVD) UNDER HIGH PRESSURE AND AN APPARATUS THEREFOR

This is a division, of application Ser. No. 561,639 filed Aug. 2, 1990 now U.S. Pat. No. 5,037,666.

FIELD OF THE INVENTION

The present invention relates to a high-speed film forming method by microwave plasma chemical vapor deposition (CVD) and an apparatus therefor, and more particularly to a film forming method and an apparatus therefor, which guides on a substrate neutral radicals and ions produced by microwave plasma from reactant gas, thereby growing a thin film.

BACKGROUND OF THE INVENTION

Recently, a method using plasma has been noticed as one of these film forming methods, which is called the plasma chemical vapor deposition (CVD) method which puts the source gas or reactant gas in the plasma state to form extremely chemically active excitation molecule, atom, ions or radicals so as to promote chemical reaction, thereby growing the thin film on a substrate. This method is largely characterized in that since a chemically active ion or a neutral radical is used in the plasma state, the thin film is producible at a low temperature. Although the conventional CVD method may often be limited to a restricted process due to high-temperature formation, the plasma CVD method, which need not put the substrate at high temperature, can perform low-temperature formation, reduce thermal damage, restrict reaction between the substrate materials, and form the thin film onto a non-heat-resistant substrate. In a case where the thermodynamic reaction, even when possible, is remarkably slow, since the plasma excitation state is related thereto, the reaction may be promoted or the reaction normally considered to be thermodynamically difficult may be possible, so that novel material having various composition ratios conventionally considered impossible can be developed or a thin film of high-temperature forming material can be produced.

In the conventional plasma CVD method, a dc glow discharge method which applies dc voltage at a relatively high degree of vacuum of 0.1 to several torr between the parallel electrodes disposed within a reaction chamber to thereby perform glow discharge and a high frequency glow discharge method, which applies high-frequency power onto a coil coiled on the outer periphery of the reaction chamber formed with a quartz tube to thereby carry out non-electrode discharge, have mainly been utilized. In such methods, pressure or partial pressure of reactant gas within the reaction chamber is set low for easiness of generating plasma, whereby the thin film formation speed, somewhat different in the kinds of reaction gas, is very slow as several hundred to several thousand Å/min. Also, since the ion acceleration direction is orthogonal to the substrate in the glow discharge method, there is a fear that ions of reactant gas accelerated to high energy cause lattice defects in the thin film on the substrate, the sputtering causes damage thereon, or carrier gas is accelerated as ions so as to be taken in the thin film.

A light excitation plasma CVD method by laser or the like has hitherto been utilized according to remarkable progress of the laser, which is larger in photon energy due to a short wavelength of the light, so that the reactant gas is directly excited along the optical path to thereby form the neutral radicals or ions of reactant species, resulting in that it is difficult spatially control the location of film formation. Therefore, the problem is created in that a film may grow at an incident window through which the light is introduced into the reaction chamber and further that the plasma is hard to generate unless a relatively high degree of vacuum is applied as the same as the above-mentioned, resulting in that the film formation speed is also low.

SUMMARY OF THE INVENTION

An object of the invention is to provide a film formation method and an apparatus therefor, which sets a mixed gas of reactant gas and carrier gas under at very higher pressure from low degree of vacuum to about several atmospheric pressure in comparison with the conventional plasma CVD, moreover raises partial pressure to a range of 10 torr through several atms to put the gas in the plasma state by microwave within a predetermined space, raise density of neutral radicals and ions of reaction species on the basis of the reactant gas to increase the thin film formation speed to the substrate, restrict dynamic energy of reaction species to be low so as to gently form the film without generating lattice defects on the substrate and grown thin film, and without damaging the thin film by sputtering, and control the direction of electric field not to damage the thin film by the electrons accelerated at high speed, thereby enabling a thin film of good quality to be grown at high speed on the substrate.

The method and apparatus of the present invention utilize standing waves or progressive waves of microwave to put reactant gas at high pressures in the plasma state and introduce onto the substrate the neutral radicals and ions on the basis of reactant gas formed by the high pressure plasma, thereby forming at high speed the thin film on the surface of the substrate.

Concretely, the present invention is a film forming method and an apparatus therefor by microwave plasma CVD, which keeps the reactant gas constant in a range of 1 torr through several atms within an airtight reaction chamber serving as a cavity resonator, introduces the microwave into the reaction chamber to generate the microwave plasma by the standing waves, and guides onto the substrate disposed in the reaction chamber the neutral radicals and ions on the basis of reactant gas formed by the plasma, thereby growing the thin film.

A film forming method and an apparatus by microwave plasma CVD of the invention keeps the reactant gas constant in a range of 1 torr through several atms within a reaction chamber which is disposed at proper location at the region where the progress wave of microwave is circulated or reflected to raise the energy density and which is passable of microwave, the microwave introduced into the reaction chamber generates plasma, and guides onto the substrate disposed in the reaction chamber the neutral radicals and ions on the basis of the reactant gas formed by the plasma, thereby growing the thin film.

The high-speed film forming method and the apparatus therefor of the present invention by use of microwave plasma CVD under high pressure of the above-mentioned contents, when the standing wave of microwave is used, shift a movable short-circuit end in the normal direction thereof in the state where the substrate is disposed within an airtight reaction chamber of reaction unit serving as the cavity resonator, and sets the short-circuit end in a resonance condition of microwave generated by a microwave generator. In a case where the progressive wave of microwave is used, an airtight reaction chamber provided with an incident-emission window through which the microwave is passable is disposed at part of a storage circuit for circulating or reflecting the microwave so as to be accumulated, into the reaction chamber is supplied carrier gas of inert gas while adjusting its flow rate by a supply unit, simultaneously a flow of gas is stabilized through a buffer tank while adjusting its flow rate by an exhaust unit, the gas is exhausted to keep the pressure in the reaction chamber constant in a range of 1 to 100 torr, in this state the microwave generated by the microwave generator introduced by a waveguide unit into the reaction unit including the reaction chamber, plasma is generated by the carrier gas, then the carrier gas is further supplied to increase pressure while adjusting by the gas supply unit the flow rate in the state of maintaining the plasma, in such state one or more than two kinds of reactant gases are supplied by the supply unit, while adjusting the flow rate, to set the entire pressure in the reaction chamber 1 torr through several atms, the partial pressure of reactant gas is set 1 torr through several atms so as to generate the plasma of high tension, high-speed electrons generated by electrolytic dissociation of microwave repeat elastic collision and not-elastic collision with the reactant gas and carrier gas, whereby neutral radicals and ions of reaction species and chemically active and low in temperature or dynamic energy are formed from the reactant gas, and the reaction species are guided to the substrate to thereby rapidly and gently grow the thin film onto the substrate.

Other objects, features and advantages of this invention will become apparent from the following description, the appended claims and accompanying drawings.

BRIEF DESCRIPTION OF THE DRAWINGS

FIG. 5 is a schematic side view showing arrangement of a reaction unit, a microwave generator and a waveguide unit at a film formation apparatus by microwave plasma CVD utilizing progressive waves, FIG. 6 is a plan view of the reaction unit provided with a storage circuit and a reaction chamber.

DETAILED DESCRIPTION OF THE INVENTION

Next, embodiments of the present invention will be detailed in accordance with the drawings.

At first, explanation will be given on a high speed film formation apparatus by the microwave plasma CVD under high pressure and utilizing standing waves on the basis of FIGS. 1 through 4.

Figure 1:
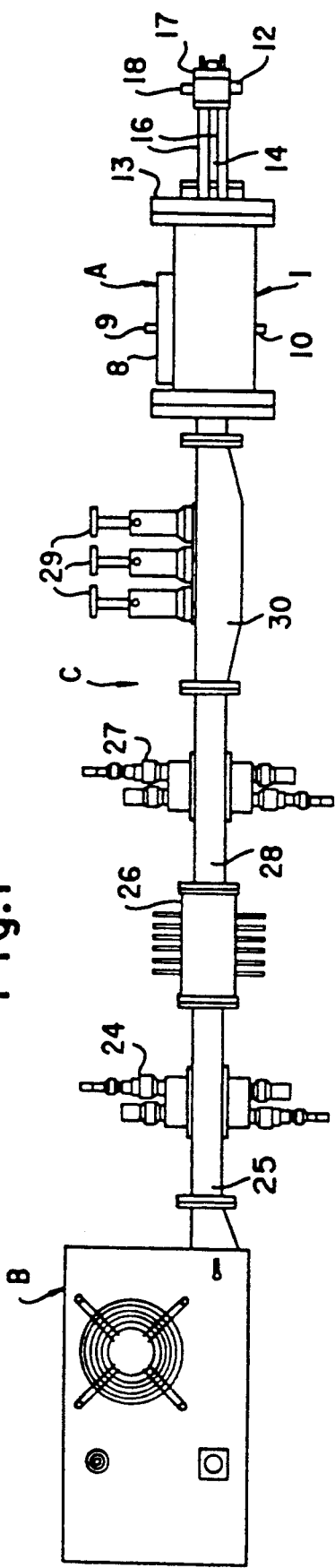
FIG. 1 is a schematic side view showing arrangement of a reaction unit, a microwave generator and a waveguide unit of a film formation apparatus by microwave plasma CVD utilizing standing waves.
Figure 2:
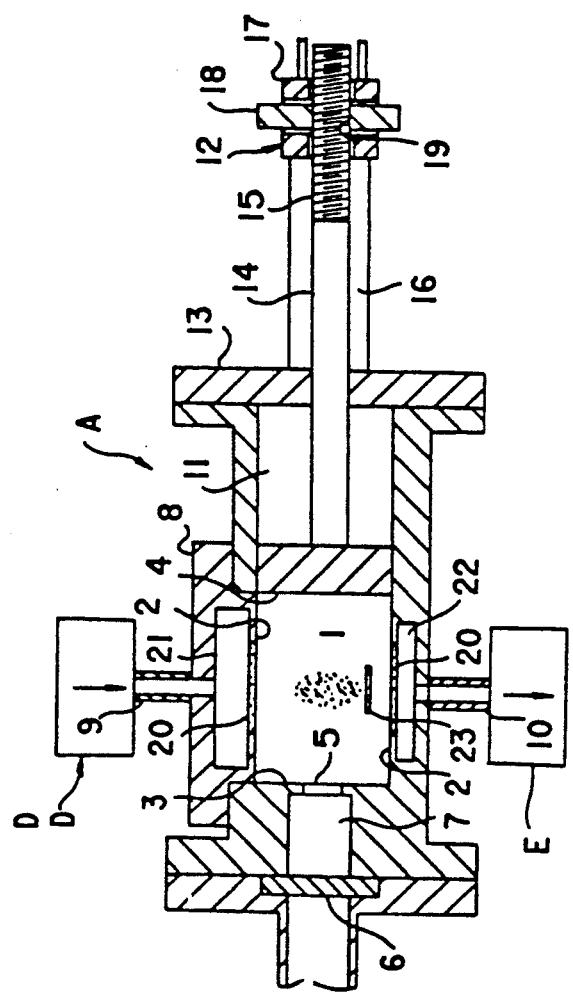
FIG. 2 is an enlarged longitudinally sectional side view of the reaction unit provided with a reaction chamber serving as a cavity resonator.
Figure 3:
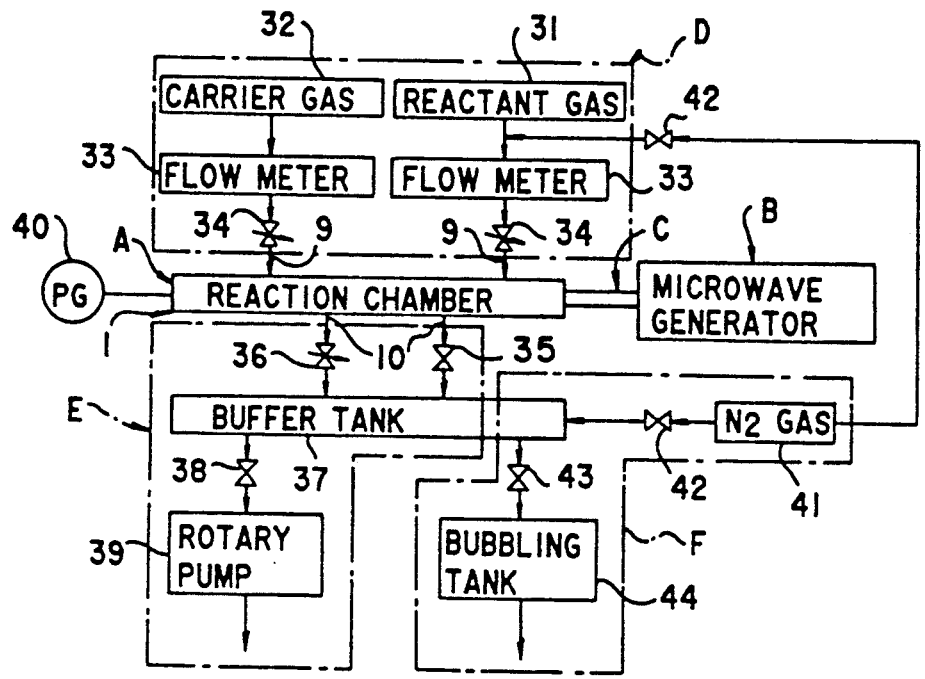
FIG. 3 is a schematic block diagram showing arrangement of the entire apparatus.

FIG. 1 shows arrangement of the film formation apparatus of the invention, FIG. 2 is an enlarged sectional view showing the principal portion of the apparatus, and FIG. 3 is a schematic view of the entire apparatus, in which reference letter A designates a reaction unit, B designates a microwave generator, C designates a waveguide unit, D designates a gas supply unit, E designates an exhaust unit, and F designates a gas processing unit.

The reaction unit A, as shown in FIG. 2, is so constructed that an airtight reaction chamber 1 serving as a square cavity resonator of basis resonance mode with respect to the microwave used in the interior is partitioned by four surrounding faces of side walls 2, an incident side wall 3 for the microwave, and a movable short-circuit end 4, at the incident side wall 3 is detachably provided a coupling window 5 which passes therethrough the microwave and can determine a degree of coupling of the reaction chamber 1 serving as a resonator resonant with a waveguide tube to be discussed below, at the outside of the coupling window 5 is provided an incident window 6 composed of quartz glass which introduces therethrough the microwave and can hold an airtight condition, a waveguide conduit 7 is formed between the coupling window 5 and the incident window 6. One of the side walls 2 is formed in a lid 8 detachably mounted and holdable of the airtight condition, a supply tube 9 for carrier gas and reaction gas is connected to the lid 8, and an exhaust pipe 10 is connected to the side wall 2 opposite the lid 8. The movable short-circuit end 4 is connected with driving means 12 so that the end 4 can shift in the normal direction, in other words, in parallel to the travelling direction of microwave within an airtight movable space 11 extending from the reaction chamber 1 and having the same configuration in section as the chamber 1. The driving means 12 is so constructed that one end of an operating shaft 14 slidably and airtightness-holdably perforates through the center of a flange 13 for closing the outside of movable space 11 is fixed to the rear surface of the movable short-circuit end 4, and a screw thread shaft 15 formed at the other projecting end of operating shaft 14 screws with a central threaded bore 19 of a disc 18 positionally rotatably provided at an operating portion 17 fixed to the flange 13 spaced apart therefrom through support rods 16, whereby the disc 18 is rotated to move the movable short-circuit end 4 in axial reciprocation through the operating shaft 14. In this embodiment, the reaction chamber 1 is sized in 96×55 mm in section, a distance between the coupling window 5 and the movable short-circuit end 4 is set about 80 mm, and displacement length of the same is set ±25 mm. Also, at the inside of the lid 8 and at the outside of reaction chamber 1 is formed a supplying spare room 21 communicating with the supply pipe 9 and partioned from the reaction chamber 1 through a partition having orifices or a lattice, and at the outside of reaction chamber 1 is formed an exhausting spare room 22 communicating with the exhaust pipe 10 and partitioned from the reaction chamber 1 by a partition 20 as the same as above-mentioned. In this case, each partition 20 serves as the side wall 2 at the resonator of microwave. A substrate 23 on which a thin film is to be formed is adapted to be fixed at a predetermined position within the reaction chamber 1 of reaction unit A. The reaction chamber 1 is adapted to keep airtightness with respect to pressure in a range of 0.1 torr through 10 atms. Depending on the kind of gas in use, air and reactant gas leaking into the reaction chamber 1 when kept less than 1 atm therein, severely react on those leaking out from the reaction chamber 1 when kept more than 1 atm, whereby care should be taken to airtightness. In addition, the reaction unit A used in the embodiment of the invention is not limited to the above-mentioned construction, but the same of optimum size and construction can be adopted corresponding to the size of the substrate to be discussed below.

The microwave generator B usually comprises a magnetron and power sources for driving and controlling it, which uses the oscillation frequency of 2.45 GHz (2450±30 MHz) and output power variable in a range of 10 through 1000 W, but it not particularly defined, the oscillation frequency and output power can properly be set in relation with the size of reaction chamber 1 at the reaction unit A.

The waveguide unit C, as shown and FIG. 2, efficiently guides the microwaves generated by the microwave generator B into the reaction chamber 1 through the incident window 6 at the reaction unit A and, in the present embodiment, comprises a square waveguide pipe 25 provided with a progressive wave output monitor 24, an isolator 26, a square waveguide pipe 28 provided with a reflected wave output monitor 27 and a waveguide pipe 30 provided with stub tuners 29, connected in series sequentially from the microwave generator B. The waveguide pipes 25 and 28 are of aluminum and use the domestic standard BRJ-2, is sized 29×96 mm, which is a TE01 mode and of the cutoff frequency of 1.56 GHz and, when less than 3.13 GHz, a higher mode other than the oscillation frequency is not propagated. The progressive wave output monitor 24 and reflected wave output monitor 27 fetch the electromagnetic field proportional only to the intensity of progressive wave or reflected wave by use of a directional coupler utilizing interference of electromagnetic waves, so that the electromagnetic field is detected by a diode. The progressive wave output monitor 24 monitors output of microwave generated by the microwave generator B, the output is fed-back to an anode current for controlling the output of magnetron to design the output stability of ±5% or less, the reflected wave output monitor 27, when impedance matching with the reaction chamberlis not taken to excessively enlarge the reflected wave, detects the reflected wave to actuate a protection circuit for protecting the magnetron. In addition, the protection circuit is adapted to operate even in other conditions, such as anode voltage, current and temperature, of magnetron exceeds the set value. The isolator 26 comprises a circulator utilizing deflection by anisotropy of ferrite in the magnetic field, the circulator portion being branched horizontally (H surface). Magnetic field by ferrite and permanent magnet is applied to the branch point, at which the microwave is bent horizontally the microwave traveling from the magnetron side is bent toward a load and that reflected therefrom is bent toward a wave absorber of the matched non-reflection termination so as to be entirely absorbed not to return the reflected wave to the magnetron. The stub tuners 29 each comprise a conductor rod detechably insertable into the waveguide pipe 30, and the waveguide pipe 30 is larger in width at the stub tuner portion. Usually, the stub tuner is composed of two or more conductor rods spaced at interval of ¼ wavelength, but, in this embodiment, three stub tuners using three conductor rods are used to adjust an insertion length thereof so as to electromagnetically change a degree of reflection to thereby enable the reflected wave to be reduced by superposed reflection from the three conductor rods and interference of reflected wave from the load, thus theoretically obtaining all the load impedance and matching.

Figure 4:
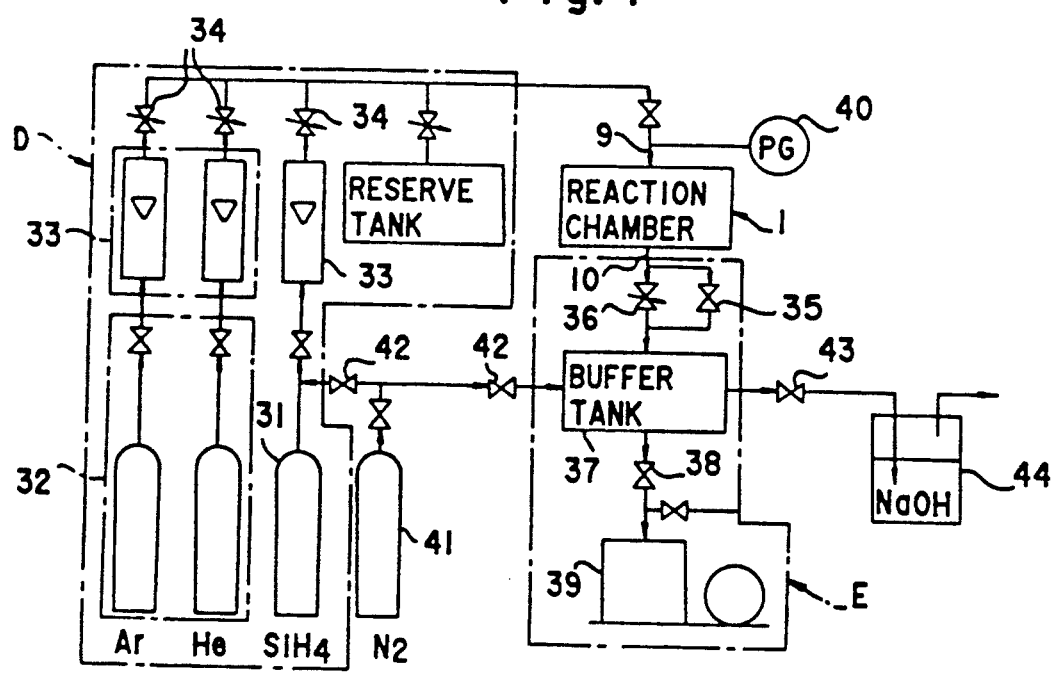
FIG. 4 is a schematic block diagram of arrangement of a gas supply unit, an exhaust unit and a gas processing unit.

The gas supply unit D, as shown in FIGS. 3 and 4, interposes flow meters 33 and needle valves 34 in a reactant gas bomb 31 and a carrier gas bomb 32 and connects them to the supply pipe 9 so that the flow rates from the reactant gas bomb 31 and carrier gas bomb 32 are adjustable to be supplied into the reaction chamber 1 of the reaction unit A, each bomb of course providing a regulator to control the back pressure. In the present embodiment, silane gas ($SiH_4$) is used at the reactant gas and inert gas of Helium (He) and Argon (Ar) as the carrier gas, but it is possible to use insert gas, such as neon (Ne), krypton (Kr) and xenon (Xe). Also, the reactant gas is properly selectable corresponding to the kind of thin film formed on the substrate 23 so that, when the silicon thin film is formed, $SiF_4$ or $SiCl_4$ other than the above is properly selected, and, when a thin film of other property is formed, a proper gas is selected from those usable by the plasma CVD, and, when phosphorus (P) or boron (B) is doped into the thin film, a separate bomb should be provided so as to enable $PH_3$ or $B_2H_6$ to be mixed a little to the reactant gas. In addition, purity of silane used in the present embodiment is 99.99% or more and includes $O_2$ (<1 ppm), $H_2O$ (<1 ppm) and $SiH_3Cl$ (<5 ppm) as impurities. Herein, the inert gas has a metastable level of long life span and property utilizing the Penning effect to excite other gas, whereby the reactant gas necessary to form a film is easy to excite and also the plasma is easy to maintain. Hence, in order to stably maintain the plasma, the inert gas is properly mixed and changed of its mixing ratio, thereby enabling the property of thin film to be controlled.

The exhaust unit E connects to an exhaust pipe 10 a buffer tank 37 sufficiently larger in volume than the reaction chamber 1 through a usual vacuum tank 35 and a needle valve 36 connected in parallel, the buffer tank 37 being connected through a vacuum valve 38 to a rotary pump 39 air-exhaustible to the degree of vacuum under 0.1 torr through a vacuum valve 38. In addition, in order to measure the degree of vacuum or pressure in the reaction chamber 1, a pressure gauge (PG) 40, such as a Pirani gauge or a Bourdon gauge, is provided at a proper position.

The gas processing unit F connects a purging gas bomb 41 for nitrogen gas ($N_2$) or the like to the buffer tank 37 and the fore stage of the flow meter 33 for the reactant gas bomb 31 through valves 42 respectively, and connects through a valve 43 to the buffer tank 37 a buffling tank 44 into which a processing liquid is filled. The valves 42 and 43 are open or closed to blow out from the flow meter 33, needle valve 34, pipelines and reaction chamber 1 leaked air and powder (silicon oxide) produced by reaction of reactant gas (silane). When the reactant gas is of low density and the entire pressure is lower than 1 atmospheric pressure, the purging gas is supplied to the buffer tank 37 to exhaust the reaction gas from the exhaust unit E while diluting it and when the same is of medium density and the entire pressure is higher than 1 atmospheric pressure, a mixed gas including the reactant gas is collected in the buffer tank 37 and sufficiently diluted by the purging gas to be about 1.5 to 2 atms, thereby processing the mixed gas in the bubbling tank 44 by the processing liquid and exhausting the same. In addition, in the embodiment, since silane is used as the reactant gas, a processing liquid of strong alkali (NaOH) is used as the processing liquid, silane is decomposed into sodium silicate and hydrogen and exhausted in the state of not-spontaneously firing. Herein, since the buffer tank 37 has sufficient volume with respect to the reaction chamber 1, it absorbs a pulsating flow of exhaust gas by a rotary pump 39 other than the processing of exhaust gas to thereby stabilize the flow, and part of powder produced by plasma CVD in the reaction chamber 1 is deposited and stopped by reducing the rate of flow due to a rapid increase in volume from the reaction chamber 1 to the buffer tank 37.

In the film formation apparatus by the microwave plasma, in order to grow a thin film on the substrate 23 disposed in the reaction chamber 1 at the reaction unit A, in the state where a sapphire R surface (a surface exponent (1T02)) is disposed in the reaction chamber 1 as the substrate 23, the disc 18 at the driving means 12 is rotated in position and the operating shaft 14 screwable with the disc 18 is moved through the flange 13 so that the movable short-circuit end 4 is shifted in the normal direction in the moving space 11 in continuation of the reaction chamber 1, and the reaction chamber 1 is adjusted to be a square cavity resonator of the basis mode ($TE_{101}$ mode) resonant with the frequency of microwave generated by the microwave generator B. When a dielectric, such as the substrate 23, is put in the reaction chamber 1, the resonance point somewhat shifts, which is corrected by the above adjustment. Next, after the entire apparatus is rough vacuumized to about 0.1 torr by the exhaust unit E, the gas supply unit D supplies carrier gas of He or Ar, residual gas is displaced to reduce mixture as impurities in the thin film, and initial plasma is easy to generate. Therefore, a regulator of the carrier gas bomb 32 is adjusted to fix the back pressure, in which the needle valve 36 is adjusted while measuring a rate of inflow by the low meter 33 so as to supply the carrier gas into the reaction chamber 1, simultaneously the needle valve 36 at the exhaust unit E is adjusted to stabilize the flow through the buffer tank 37 while adjusting the exhaust flow rate and the rotary pump 39 exhausts gas so as to keep the degree of vacuum in the reaction chamber 1 in a range of 1 through 100 torr, for example, about 50 torr, easy to generate plasma. The supplying spare room 21 and exhaust spare room 22 communicating with the supply pipe 9 and exhaust pipe 10 of the exhaust unit E and formed outside the reaction chamber 1 and partitioned therefrom by partitions 20 having a large number of orifices or lattices are used to stabilize the flow of reactant gas and carrier gas in the reaction chamber 1 and make its density about uniform, thereby allowing the gases to pass through the partitions 20 respectively. Hence, the plasma is not locally cooled, but high pressure plasma can stably be maintained. In such the state, the microwave of 200 W generated by the microwave generator B passes the square waveguide pipe 25 provided with the progressive wave output monitor 24, isolator 26, square waveguide pipe 28 provided with the reflected wave output monitor 27, and waveguide pipe 30 provided with the stub tuners 29 at the waveguide unit C and the microwave takes matching with impedance so as to be guided from the incident window 6 at the exhaust unit E into the reaction chamber 1 through the coupling window 5, thereby generating the plasma by the carrier gas. Then, in the state of maintaining the plasma, the carrier gas is further supplied by the gas supply unit D while adjusting the flow rate to thereby raise pressure up to about 1 atmospheric pressure for about four minutes. In such condition, one or two kinds of reactant gas, that is, silane for forming the thin film or mixture of impurity gas doping with silane, is supplied by the gas supply unit D while adjusting the flow rate so as to raise the entire pressure in the reaction chamber 1 to be set 10 torr through several atms, partial pressure of reactant gas is set to 1 torr through several atms. While keeping the pressure, microwave power is raised up to 400 through 800 W to generate plasma of high tension and operate film formation for 1 through 15 minutes. In other words, the high speed electrons generated by electrolytic dissociation by the microwave repeat elastic collision and not elastic collision with the reactant gas and carrier gas, so that neutral radicals and ions of reaction species chemically active and lower in dynamic energy are produced from the reactant gas, the reaction species being guided onto the substrate 23, thereby rapidly and gently growing a silicon thin film thereon. In addition, it is preferable for the high speed film formation that the total pressure and partial pressure of reactant gas is set as high as possible.

The film formation apparatus by the microwave plasma CVD utilizing the standing waves of microwave uses the cavity resonator itself as the reaction chamber, whereby although large electric field strength is obtained, a plasma generating region is restricted, and the substrate 23 is limited in the size. Hence, next, explanation will be given on a high-speed film formation apparatus by the microwave plasma CVD utilizing the progressive waves of microwave capable of enlarging the substrate 23 and of generating the plasma at a further wide region, in which other constructions except for the reaction unit A are about the same as those utilizing the standing waves, whereby the same construction is designated by the same reference numerals and explanation thereof will be omitted.

When the progressive waves of microwave are utilized, it is important, although uniform plasma can be obtained at a wide region along the traveling direction of microwave, how to raise the electric field strength in order to generate the plasma even at pressure of 1 atm or more and stably maintain the plasma.

In the present invention, in order to raise the electric field strength of progressive wave, in other words, the energy density, a reaction unit A to be discussed below is used.

The reaction unit A shown in FIGS. 5 and 6 is provided at a proper position of a storage circuit comprising a ring-like waveguide pipe for circulating the progressive wave of microwave with a branch 46 for introducing the microwave and part of the storage circuit 45 is used as the reaction chamber 1. Concretely, the storage circuit 45 connects a linear waveguide pipe 47 and a circular-arc waveguide pipe 48, thereby being ring-like-shaped. One linear waveguide pipe 47 is set at its end to be larger in cross-sectional area to connect the circular-arc waveguide pipe 48 and the tapered branch 46. The other linear waveguide pipe 47 is set short, and between the pipes 47 is connected the reaction chamber 1 shown in FIG. 7, wherein the microwave energy is not efficiently incident due to mismatching of impedance when a sectional area of waveguide pipe at the waveguide unit C abruptly changes, whereby a width of linear waveguide pipe 47 connected to the branch 46 is set sufficiently larger in comparison with the wavelength of microwave and furthermore, the circular-arc waveguide pipe 48 is set larger in width at the side connecting to the linear waveguide pipe 47 provided with the branch 46. Also, width of linear waveguide pipe 47 at the side of connecting the reaction chamber 1 is desirable to be as small as possible in order to raise the energy density of microwave, but in consideration of transport mode of microwave, the width of each member inclusive of the reaction chamber 1 is set 150 mm and the reaction chamber 1 is set to be 10 mm high. In addition, the storage circuit 45 other than the reaction chamber 1 is 55 mm high.

The above-mentioned size, however, is only exemplary and need be set properly corresponding to the frequency of microwave in use.

Figure 7:
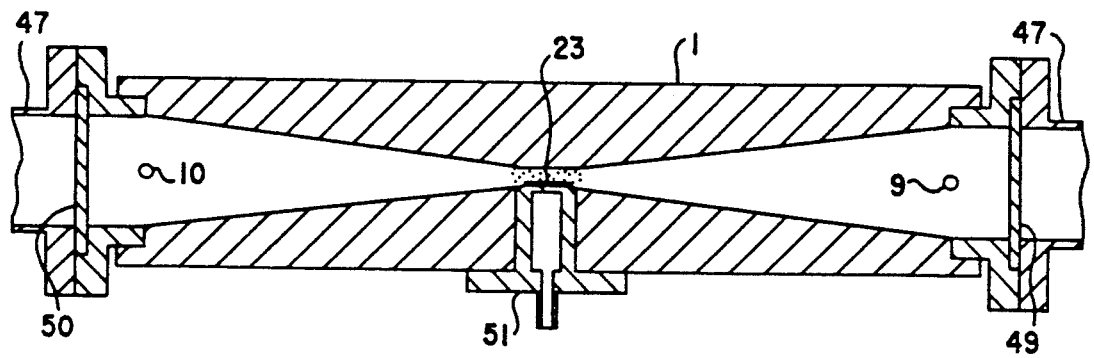
FIG. 7 is an enlarged sectional view of the reaction chamber when the progressive waves are used.

The reaction chamber 1 shown in FIG. 7 is tapered in section gently toward the center to further raise energy density of microwave at the central portion so that the plasma is collectively generated at the central portion. At the connecting portions of reaction chamber 1 with the linear waveguide pipes 47 are provided in the airtight condition incident-emission windows 49 and 50 of quartz plate through which the microwave is passable, inside which are provided the reaction gas and carrier gas supply pipe 9 and exhaust pipe 10. Furthermore, at the central portion the smallest in section is formed to hold the substrate 23 and a water cooling heat exchanger 51 is mounted to a bore formed at the large thickness portion of reaction chamber 1 in the vicinity of the holding portion for the substrate 23 so as to prevent the temperature thereof from excessively rising. Herein, the substrate 23 is mountable on the end face of the detachable heat exchanger 51 and mounted together with the heat exchanger 51 to the reaction chamber 1.

The microwave generated by the microwave generator B is guided to the reaction unit A through the waveguide unit C, circulates in the storage circuit 45 constituting the reaction unit A, and gradually atenuates by minute power reflection caused by the energy loss at the wall of waveguide pipe and curvature thereof. However, totally, since the microwave circulates several times in the storage circuit 45, at the inside of storage circuit 45, especially at the center of reaction chamber 1, the energy density of microwave is amplified several tens times or more. When a ratio of energy lost by a skin current flowing on the wall of waveguide pipe while the microwave once circulates the storage circuit 45 is represented by $\alpha$, a ratio of energy reflected by the curvature of waveguide by $\gamma$, an energy incident at a certain instant by Ao, and an energy traveling forwardly from the junction by An ($n \geq 0$), the following equation is given:

$$a_n = (1-\alpha)(1-\gamma)a_{n-1}$$
$$= ((1-\alpha)(1-\gamma))^n a_o.$$

Therefore, the energy density U stored in the storage circuit 45 is given in the following equation:

$$U = \sum_{n=0}^{\infty} a_n$$
$$= 1/(1-(1-\alpha)(1-\gamma)) \cdot a_o.$$

Total reflected power R measurable by the reflected wave output monitor 27 is given in the following equation:

$$R = \sum_{n=0}^{\infty} \gamma(1-\alpha)a_n$$
$$= \gamma(1-\alpha)/(1-(1-\alpha)(1-\gamma)) \cdot a_o.$$

Figure 8:
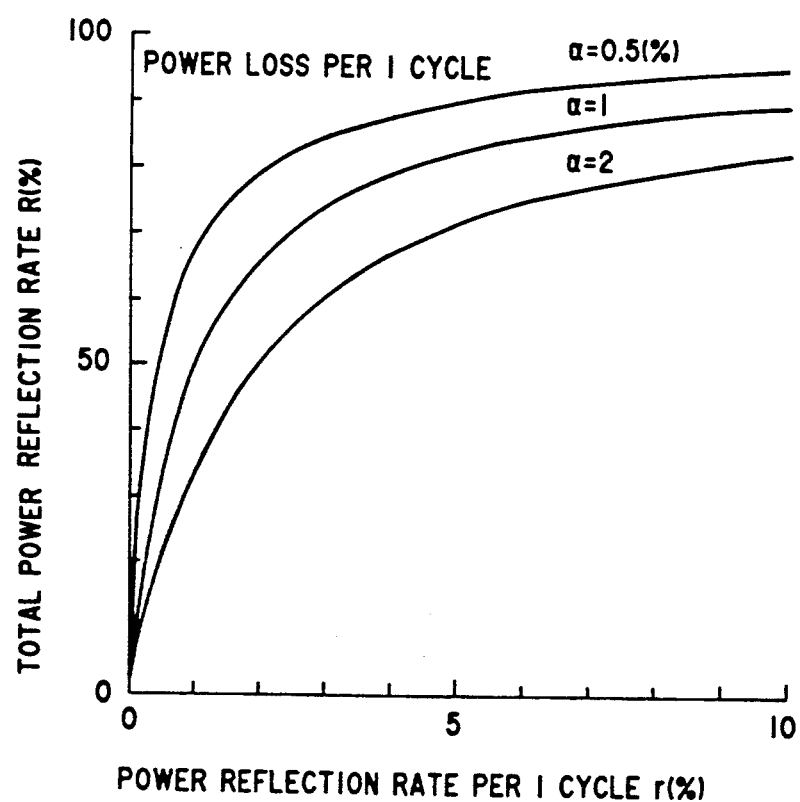
FIG. 8 is a graph showing a reflection rate of the microwave of the storage circuit.

FIG. 8 is a graph representing a total power reflection rate R(%) with respect to a power reflection rate $\gamma$(%) by using a power loss rate $\alpha$(%) per 1 cycle of the storage circuit 45, in which it is estimated to what extent the energy density or electric field strength is actually obtained in the reaction chamber 1. Actually, in the case where the present apparatus is used, when incident power is 500 W, the reflected power is about 300 W (R≈60%), and $\alpha$ is assumed to be about 1%, whereby $\gamma$ is estimated to be about 1.5%. When values of $\alpha$ and $\gamma$ are used, the energy density U is 40×A0 from the former equation.

When waveguide pipe material of storage circuit 45 is aluminum and in the $TE_{02}$ mode, the maximum electric field strength E at the reaction chamber 1 is given in $$E = 1.32 \times 10^3 \sqrt{U}.$$

Therefore, when the incident power is 500 W, $$E = 1.86 \times 10^5 (V/m)$$

is obtained. Hence, it is seen that electric field strength enough to generate and maintain the plasma of 1 atmospheric pressure is obtained.

Figure 9:
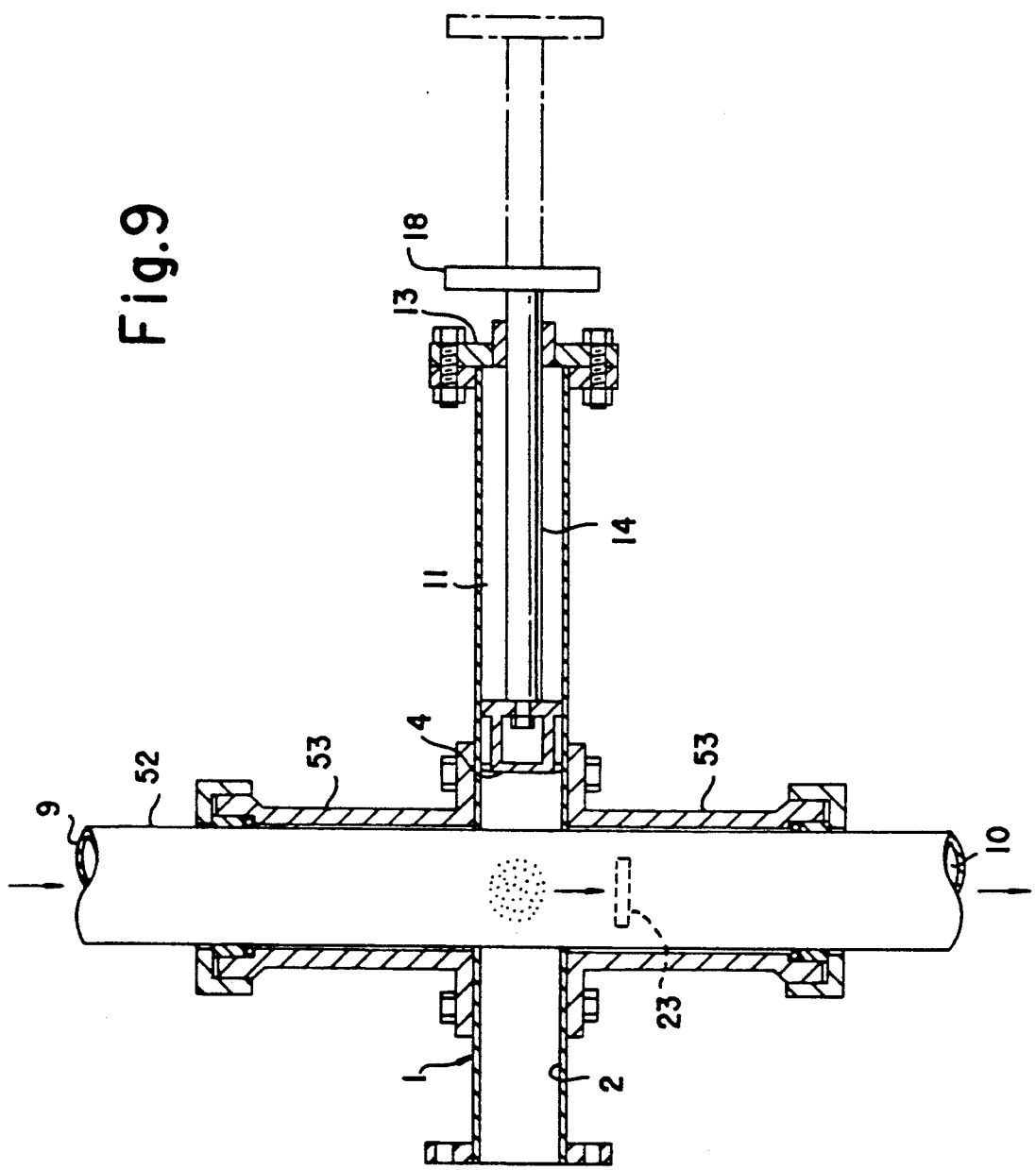
FIG. 9 is a sectional view of an apparatus which, in the reaction unit utilizing the standing waves, transports the plasma generated within the reaction chamber to a space different from the plasma generating region, thereby growing the thin film on the substrate.
Figure 10:
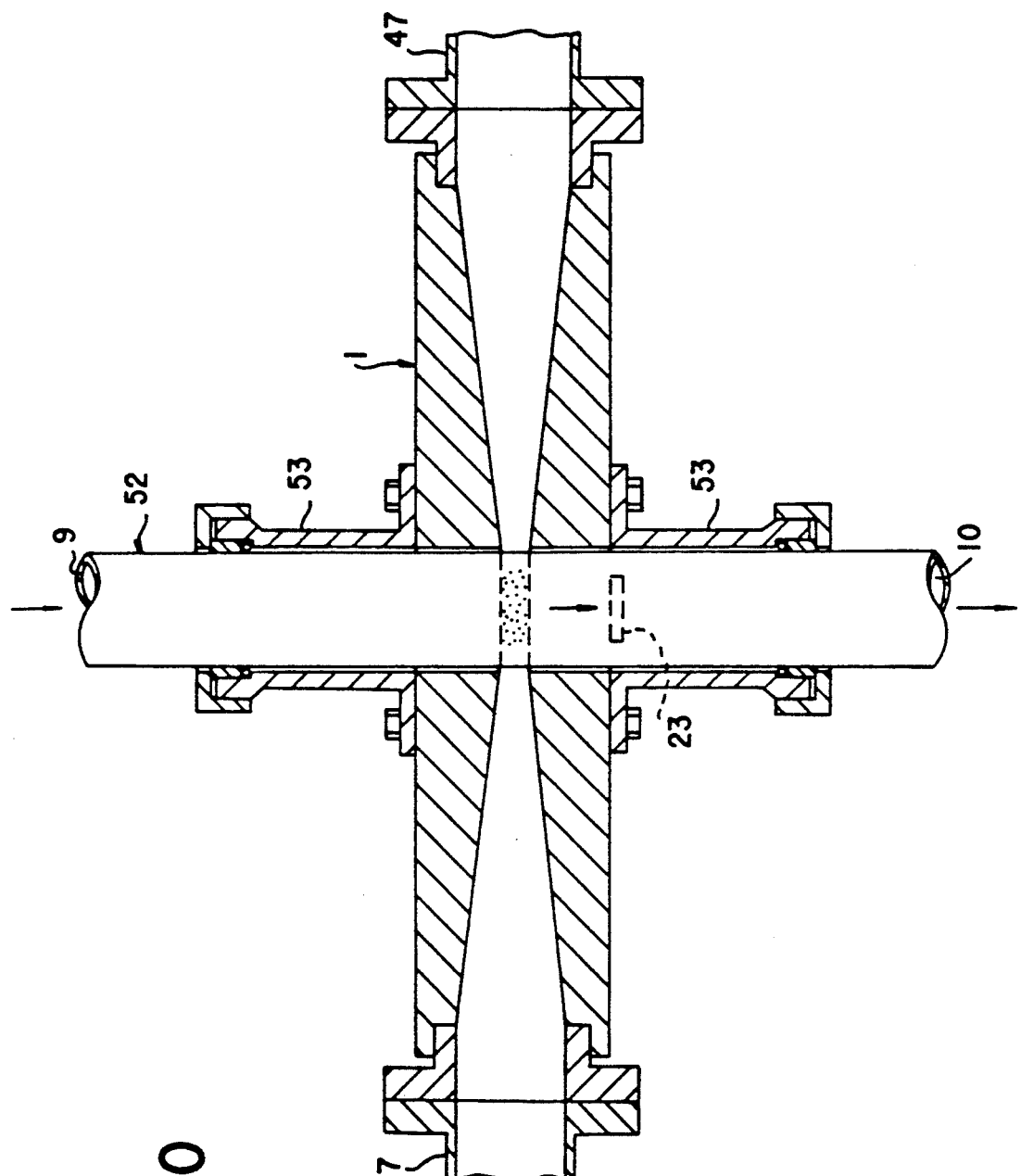
FIG. 10 is a sectional view of an apparatus which, in the reaction unit utilizing progressive waves, transports the plasma generated within the reaction chamber to a space different from the plasma generating region, thereby growing the thin film on the substrate.

Next, modified embodiments of the reaction chamber 1 are shown in FIGS. 9 and 10. In the aforesaid embodiment, the plasma generating region and substrate 23 are in about the same positions, but they need not inevitably coincide with each other, but for growing the thin film on the substrate 23 of large size, it is desirable that they are rather different in position.

FIG. 9 shows a reaction unit at the film formation apparatus utilizing standing waves, in which a reaction pipe 52 formed of material through which the microwave is passable and perforating a reaction chamber 1 serving as a cavity resonator is provided. The reaction pipe 52 being held by ports 53 fixed to the reaction chamber 1, and one part of reaction pipe 52 is used as a supply pipe 9 and the other part as an exhaust pipe 10. The substrate 23 is held by proper means at a side of exhaust pipe 10 within the reaction pipe 52. In this case, the reaction chamber need not be airtight, so that the incident window 6 shown in FIG. 2 is not required. The reactant gas and carrier gas supplied from the supply pipe 9 of the reaction pipe 52 are converted into plasma at the position where the cavity resonator at the reaction chamber 1 is constituted, the plasma being transported together with the flow of gas to the substrate 23, whereby neutral radicals and ions on the basis of reactant gas grow the thin film as above-mentioned.

FIG. 10 shows a reaction chamber 1 of the film formation apparatus utilizing the progressive waves, in which a reaction pipe 52 perforates the central portion of the reaction chamber 1 shown in FIG. 7 and is held by ports 53 similarly to the above. In this case, the reaction chamber 1 itself is provided with no supply pipe 9 and exhaust pipe 10, and both ends of reaction pipe 52 correspond thereto. Also, the incident-emission windows 49 and 50 are not required.

Next, further modified embodiments of the reaction unit A will be shown in FIGS. 11 through 14.

Figure 11:
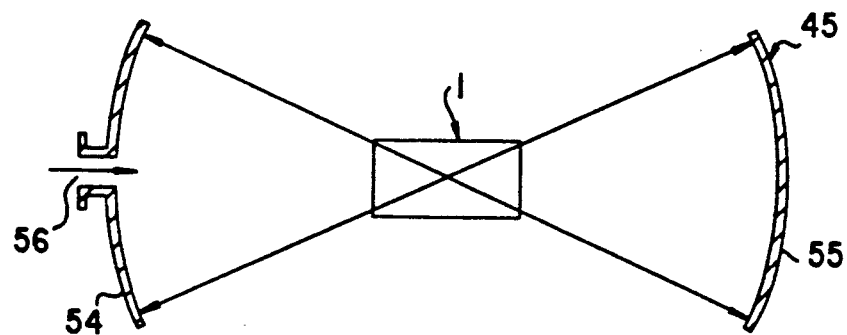
FIG. 11 is a schematic sectional view of an embodiment which uses a storage circuit arranging a pair of microwave reflecting concave mirrors opposite to each other in the reaction unit utilizing the progressive waves.

A reaction unit A shown in FIG. 11 is so constructed that a pair of microwave reflecting concave mirrors 54 and 55 are disposed opposite to each other, at part of one concave mirror 54 is formed an introduction portion 56 through which the microwave is passable so as to constitute a storage circuit 45 and between both the concave mirrors 54 and 55 is disposed the reaction chamber 1 provided with the incident-emission window through which microwave is passable. The microwave incident from the introduction portion 56 is multi-reflected between both the concave mirrors 54 and 55, but at an intermediate portion therebetween exists a region where the energy density of microwave becomes high by the convergence of concave mirrors 54 and 55, the reaction chamber 1 being disposed in the region.

Figure 12:
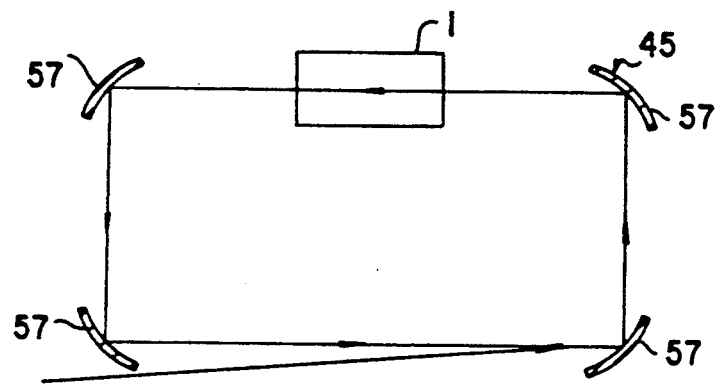
FIG. 12 is a schematic sectional view of a modified embodiment which uses a storage circuit arranging three or more microwave reflecting concave mirrors in the reaction unit utilizing the progressive waves.

A reaction unit A shown in FIG. 12 disposes at corners three or more, in the drawing, four microwave reflecting concave mirrors 57 so as to constitute a storage circuit 45 and the microwave is incident to one of the mirrors and sequentially reflecting-circulates, so that the reaction chamber 1 is disposed traversing the path of microwave between the pair of concave mirrors 57.

Figure 13:
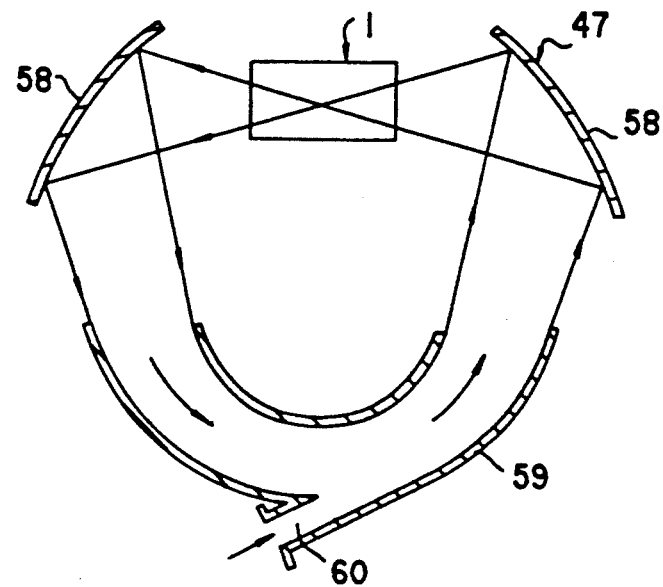
FIG. 13 is a schematic sectional view of another modified embodiment using a storage circuit comprising microwave reflecting concave mirrors and a curved waveguide tube in the reaction unit utilizing the progressive waves.

A reaction unit A shown in FIG. 13 is so constructed that microwave reflecting concave mirrors 58 are combined with a curved waveguide pipe 59 to form a storage circuit 45. A microwave introduction portion 60 is provided at the outer periphery of the curved waveguide pipe 59, the two concave mirrors 58 are disposed at the positions facing both open ends of curved waveguide pipe 59 respectively, and the reaction unit A is disposed between both the concave mirrors 58.

Figure 14:
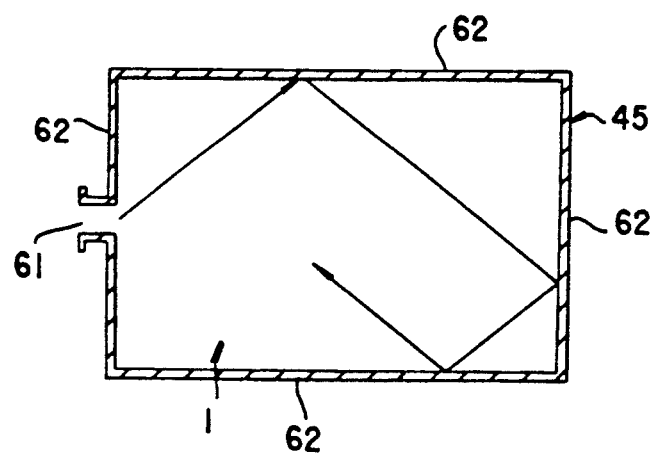
FIG. 14 is a schematic sectional view of still another modified embodiment using a storage circuit surrounded by microwave reflecting mirrors at the periphery of the storage circuit except for an inlet for the microwave in the reaction unit utilizing the progressive waves.

A reaction unit A shown in FIG. 14 is so constructed that microwave reflecting mirrors 62 surround the chamber except for a microwave introduction portion 61 so as to constitute a storage circuit 45 so that the storage circuit 45 itself serves as the reaction chamber 1. In fact, the mirrors 62 utilize the inner surface of a box-like reaction chamber 1.

In the present invention, since the microwave is used for generating the plasma, the microwave is larger in wavelength as the electromagnetic wave, so that the reactant gas cannot directly be excited. Hence, the electrons are once accelerated at the electric field, energy of electromagnetic wave is converted into dynamic energy of electron, and reaction species are formed by collision of accelerated electron with the reactant gas. Accordingly, spatial distribution of reaction species is controllable due to the distribution configuration of electric field, in other words, controllable of location to form the film. Especially, the present invention generates the plasma under high pressure, whereby the plasma is local in its generation region and superior in controllability of film formation place. Furthermore, the direction of electric field of microwave is controlled to change the relative position of the direction of electric field to the substrate 23, so that the ions or electrons accelerated at the electric field and of high energy can be prevented from being incident to the substrate 23, thereby eliminating damage by high speed particles.

At last, explanation will be given on characteristic of the silicon thin film formed on the substrate 23 by use of the film formation apparatus utilizing the standing waves.

Therefore, the properties of thin films produced under two kinds of conditions are compared as follows. A first specimen is compared by assuming a flow rate of silane gas 35 ml/min and that of helium 350 ml/min, the partial pressure of silane gas being set to 70 torr, the microwave power being 400 W. A second specimen is compared by assuming a flow rate of silane gas 200 ml/min, the partial pressure of silane gas being set to 130 torr, the microwave power being 600 W. The result of observing both the specimens by diffraction of reflecting electron beam, and Nomarski scanning electron microscope is described as follows: When the lattice constants of both the specimens are obtained by reflecting electron beam diffraction images, they are coincident with the lattice constant of siliconcrystal, whereby it has been known that the produced film is of a polycrystal film of silicon. Next, from the result of observing the surface formation by use of a Nomarski differential interferometer, a Raman scattering spectroscope and the scanning electron microscope, it has been known that a thin film less in roughness at the surface and superior in flatness can be produced as the partial pressure of silane gas is high. Also, it is known from a thickness of the film measured by an interference film thickness gauge that the film formation speed of the method of the invention can be 1 μm/sec on condition and is larger than at least 1 μm/min.

The above-mentioned result is an example of experiment showing effectiveness of the present invention. It is possible for forming the film superior in flatness, rapid in the film formation speed, and less in damage by lattice defect or sputtering by setting optimum the wavelength of microwave, incident power, flow rate of reactant gas and carrier gas, and total pressure and partial pressure of reaction gas.

As seen from the above, the apparatus of the invention can generate the neutral radicals and ions at high density and form the high speed film formation and obtain the sperior surface without generating high speed ions or electrons to enable a large area of film to be designed.

The substrate is disposed in the reaction chamber, the various reactant gases and carrier gas are supplied therein and simultaneously exhausted to keep total pressure therein 10 torr through several atms and partial pressure 1 torr to several atms, the microwave introduced into the chamber as the above-mentioned generates the microwave plasma, and the neutral radicals and ions are guided to grow the film on the substrate, whereby it is possible to raise density of neutral radicals and ions to make the film formation speed 1 $\mu$m/sec, and at least 1 $\mu$m/min. The microwave is used to enable a good thin film to be obtained as the above-mentioned. Also, the accelerated electrons can easily control the direction of electric field, the neutral radicals and ions are controlled of spatial distribution by controlling the generating position of plasma. No electrode in the reaction chamber prevents impurities from entering therein.

At first, the carrier gas is supplied to the reaction chamber and simultaneously exhausted in order to generate and maintain the plasma in the constant state, so that the microwave is charged into the reaction chamber to generate microwave plasma, supply of carrier gas increases to raise the inner pressure, the reactant gas is supplied to fix the total pressure to 100 torr through several atms and partial pressure to 1 torr through several atms, thereby enabling the plasma to be stably generated, and the film formed only under high pressure can make constant the film formation speed and uniform in property. Also, the reactant gas necessary for film formation is easily excited because the inert gas has the property as the above-mentioned, and also the plasma is easy to maintain. Hence, the property of film is controllable by properly mixing the insert gas and change its mixing ratio.

The supplying spare room and exhausting spare room are formed as the above-mentioned, so that the reactant gas and carrier gas are diffused prior to entering into the chamber and at the exhaust spare room the flow of gas is rapid, whereby the reactant gas and carrier gas stably flow and are about uniform in density, and the plasma of about atmospheric pressure can stably be maintained without locally cooling the plasma.

The movable short-circuit end at the reaction chamber is displaced in the normal direction, thereby enabling the basic resonance mode at the microwave in use to be set in the state of disposing in the reaction chamber the dielectric of substrate.

The film formation method and apparatus of the invention can grow a large area of film at a high speed onto the substrate because of generating the plasma of reaction gas and carrier gas in a wide area.

Furthermore, the coupling window is provided as the above-mentioned, and the aforesaid waveguide pipe provided with progressive output monitor, isolator, waveguide pipe provided with the reflected wave output monitor, and waveguide pipe provided with the stub tuner, are mounted in series, so that matching with load impedance of reaction chamber is obtained, the microwave can stably be shut in the reaction chamber, the energy loss can be minimized, and the microwave generator can be protected from the reflected wave.

Although several embodiments have been described, they are merely exemplary of the invention and not to be constructed as limiting, the invention being defined solely by the appended claims.

What is claimed is:

1. A high speed film forming apparatus by microwave plasma chemical vapor deposition (CVD) under high pressure relative to pressures at which microwave plasma CVD apparatus normally operate, comprising;

a reaction unit having a storage circuit for allowing progressive waves of microwave to circulate or reflect so as to accumulate said microwave, provided at part of said storage circuit with an incident-emission window through which said microwave is passable, provided with an airtight reaction chamber capable of holding therein a substrate to form thereon a desired thin film, and forming at said reaction chamber a supply pipe and an exhaust pipe for carrier gas and reaction gas communicating therewith respectively;

a microwave generator for supplying to said reaction unit progressive waves of microwave of a predetermined wavelength;

a waveguide unit for guiding to said reaction unit said microwave generated by said microwave generator and having at least a waveguide pipe;

a gas supply unit for adjusting flow rates of said carrier gas and reactant gas and supplying said gases to said supply pipe of said reaction unit;

an exhaust unit for adjusting flow rates of said carrier gas and reactant gas and exhausting said gases from said exhaust pipe at said reaction unit through a buffer tank by a vacuum pump, and a gas processing unit for supplying purging gas to said buffer tank and said supply pipe for said reaction gas and provided with a bubbling tank which is connected to said buffer tank so as to process a mixed gas comprising said reaction gas, carrier gas and purging gas.

2. A high speed film forming apparatus according to claim 1, wherein said reaction unit is provided with a branch through which said microwave is introduced into said storage circuit comprising a ring-like-shaped waveguide pipe, and part of said storage circuit served as said reaction chamber.

3. A high speed film forming apparatus according to claim 1, wherein said reaction unit disposes a pair of microwave reflecting concave mirrors opposite to each other so that said reaction chamber is disposed between both said mirrors at said storage circuit which forms at part of one of said mirrors an introduction portion through which said microwave is passable.

4. A high speed film forming apparatus according to claim 1, wherein said reaction unit forms a storage circuit disposing three or more microwave reflecting concave mirrors, said microwave is introduced into one of said mirrors to be sequentially reflectably circulated, and said reaction chamber is disposed between said pair of mirrors.

5. A high speed film forming apparatus according to claim 1, wherein said reaction unit forms a storage circuit which circulates said microwave by microwave reflecting concave mirrors and a curved waveguide pipe provided with a microwave introducing portion, and said reaction chamber is disposed at said storage circuit.

6. A high speed film forming apparatus according to claim 1, wherein said reaction unit forms a storage circuit surrounded by microwave reflecting mirrors except for said microwave introducing portion so that said storage circuit serves as said reaction chamber.

7. A high speed film forming apparatus according to claim 1, wherein said waveguide unit is provided with a waveguide pipe provided with a progressive wave of microwave output monitor, and isolator, a waveguide pipe provided with a reflected wave output monitor, and a waveguide pipe provided with a stub tuner, connected in series sequentially from said microwave generator.

* * * * *